(12) United States Patent
Wang et al.

(10) Patent No.: US 8,422,332 B2
(45) Date of Patent: Apr. 16, 2013

(54) APPARATUS FOR GENERATING A VOLTAGE AND NON-VOLATILE MEMORY DEVICE HAVING THE SAME

(75) Inventors: In Soo Wang, Chungcheongbuk-do (KR); Yu Jong Noh, Seoul (KR); Lee Hyun Kwon, Gyeongsangbuk-do (KR); Bon Kwang Koo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/243,771

(22) Filed: Sep. 23, 2011

(65) Prior Publication Data

US 2012/0014182 A1  Jan. 19, 2012

Related U.S. Application Data

(62) Division of application No. 12/473,302, filed on May 28, 2009, now Pat. No. 8,050,099.

(30) Foreign Application Priority Data

May 30, 2008  (KR) .............................. 2008-0051037

(51) Int. Cl.
  *G11C 8/00* (2006.01)
  *G11C 11/34* (2006.01)
  *G11C 16/04* (2006.01)
  *G11C 16/06* (2006.01)

(52) U.S. Cl.
  USPC ............ 365/233.19; 365/185.18; 365/185.21; 365/185.22

(58) Field of Classification Search ............. 365/185.18, 365/185.21, 185.22
  See application file for complete search history.

(56) References Cited

U.S. PATENT DOCUMENTS

| 8,050,099 | B2 * | 11/2011 | Wang et al. | 365/185.18 |
| 2007/0183207 | A1 * | 8/2007 | Park | 365/185.22 |
| 2009/0296465 | A1 * | 12/2009 | Wang et al. | 365/185.2 |
| 2010/0238729 | A1 * | 9/2010 | Lee et al. | 365/185.11 |

* cited by examiner

Primary Examiner — Ly D Pham
(74) *Attorney, Agent, or Firm* — IP & T Group LLP

(57) ABSTRACT

An apparatus for generating a voltage includes a first voltage outputting circuit configured to receive an input voltage and adjust and output a first voltage in accordance with a temperature, a buffer circuit configured to receive the first voltage and output the received first voltage as a second voltage at an output node of the buffer circuit, and a second voltage outputting circuit configured to receive the second voltage at an input terminal and output a third voltage by dividing a driving voltage in accordance with a resistance ratio, wherein the second voltage outputting circuit includes a sub-voltage outputting circuit and a controlling circuit configured to adjust a voltage level of the third voltage through a feedback of the third voltage to the input terminal.

10 Claims, 3 Drawing Sheets

APPARATUS FOR GENERATING A VOLTAGE AND NON-VOLATILE MEMORY DEVICE HAVING THE SAME

CROSS-REFERENCE TO RELATED APPLICATIONS

This application is a division of U.S. patent application Ser. No. 12/473,302 filed on May 28, 2009 now U.S. Pat. No. 8,050,099, which claims priority from Korean Patent Application No. 10-2008-0051037, filed on May 30, 2008. The disclosure of each of the foregoing applications is incorporated herein by reference in its entirety.

BACKGROUND OF THE INVENTION

The present invention relates to an apparatus for generating an operation voltage of a non-volatile memory device. More particularly, the present invention relates to an apparatus for generating a voltage for controlling an output voltage, of which a voltage level is not limited, in accordance with ambient temperature and a non-volatile memory device having the same.

A flash memory device as one of a non-volatile memory device includes typically a plurality of strings, wherein one string has memory cells connected in series.

The flash memory device is widely used in various semiconductor devices such as a laptop, a personal digital assistant PDA, a portable electrical device, e.g. portable phone, a printer, an universal serial bus USB driver, etc.

Generally, in a memory cell array of the flash memory device, memory cells are connected in series between a bit line BL and a cell source line CSL.

A NAND-flash memory device includes a drain source transistor DST and a source selective transistor SST so as to connect electrically a memory cell to the bit line BL and the cell source line CSL.

The non-volatile memory device uses a multi level cell MLC for storing data of plural bits so as to increase storage capacity of the data.

That is, since one memory cell stores the data of the plural bits, storage capacity of the non-volatile memory device is increased. However, since many threshold voltage distributions exist when the memory cell is programmed, a time to be taken for the programming has been increased. Accordingly, various techniques for reducing the time have been developed.

On the other hand, a threshold voltage of the memory cell in the non-volatile memory device is changed depending on a temperature. Hence, the threshold voltage of the memory cell may be considerably changed due to a difference of a temperature when the memory cell is programmed and a temperature when the data is read. Accordingly, data may be erroneously read in case of reading the data on the basis of a predetermined read voltage.

The above information disclosed in this Background section is only for facilitating understanding of the background of the invention and may not constitute prior art.

SUMMARY OF THE INVENTION

It is a feature of the present invention to provide an apparatus for generating a voltage for providing a read voltage changed in accordance with ambient temperature so that data is read without error though the temperature is changed and a non-volatile memory device having the same. Here, level of the read voltage is not limited.

An apparatus for generating a voltage comprising: a first voltage outputting circuit configured to receive an input voltage and adjust and output a first voltage in accordance with a temperature; a buffer circuit configured to receive the first voltage and output the received first voltage as a second voltage at an output node of the buffer circuit; and a second voltage outputting circuit configured to receive the second voltage at an input terminal and output a third voltage by dividing a driving voltage in accordance with a resistance ratio, wherein the second voltage outputting circuit includes a sub-voltage outputting circuit and a controlling circuit configured to adjust a voltage level of the third voltage through a feedback of the third voltage to the input terminal.

In another aspect, the present invention provides an apparatus for generating a voltage comprising: a memory cell array including memory cells; a page buffer circuit including page buffers, wherein each page buffer is coupled to a bit line corresponding to the memory cells and is configured to temporarily store data to be programmed to a specific memory cell or store data read from a given memory cell; a voltage generating circuit configured to receive an input voltage, to adjust and output a first voltage in accordance with a temperature, and to generate, by dividing a driving voltage in accordance with a resistance ratio, an operation voltage for read or verification; and a controller configured to output a first control signal for storing or reading data in the memory cell array; a voltage generating circuit configured receive an input voltage, to adjust and output a first voltage in accordance with a reference voltage and a temperature and outputs a voltage, and to generate, by dividing a high driving voltage in accordance with a resistance ratio, as an operation voltage for read or verification; and a controller configured to output a first control signal for storing or reading data in the memory cell array or reading the data.

In yet another aspect, the present invention provides generating, from a supply voltage, a first voltage having a voltage level that varies in response to a temperature change; receiving at a non-inverting input node of an amplifier and feeding a second voltage at an output node of the amplifier to an inverting input node of the amplifier; dividing a driving voltage higher than the supply voltage to provide an operation voltage; and feeding back the operation voltage to a comparator and adjusting the operation voltage in response to the comparison.

As described above, an apparatus for providing a voltage and a non-volatile memory device of the present invention provide a read voltage, which is adjusted in accordance with ambient temperature, thereby reducing error when data is read, and outputting the read voltage having desired level without limiting the read voltage in case of a multi level cell.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
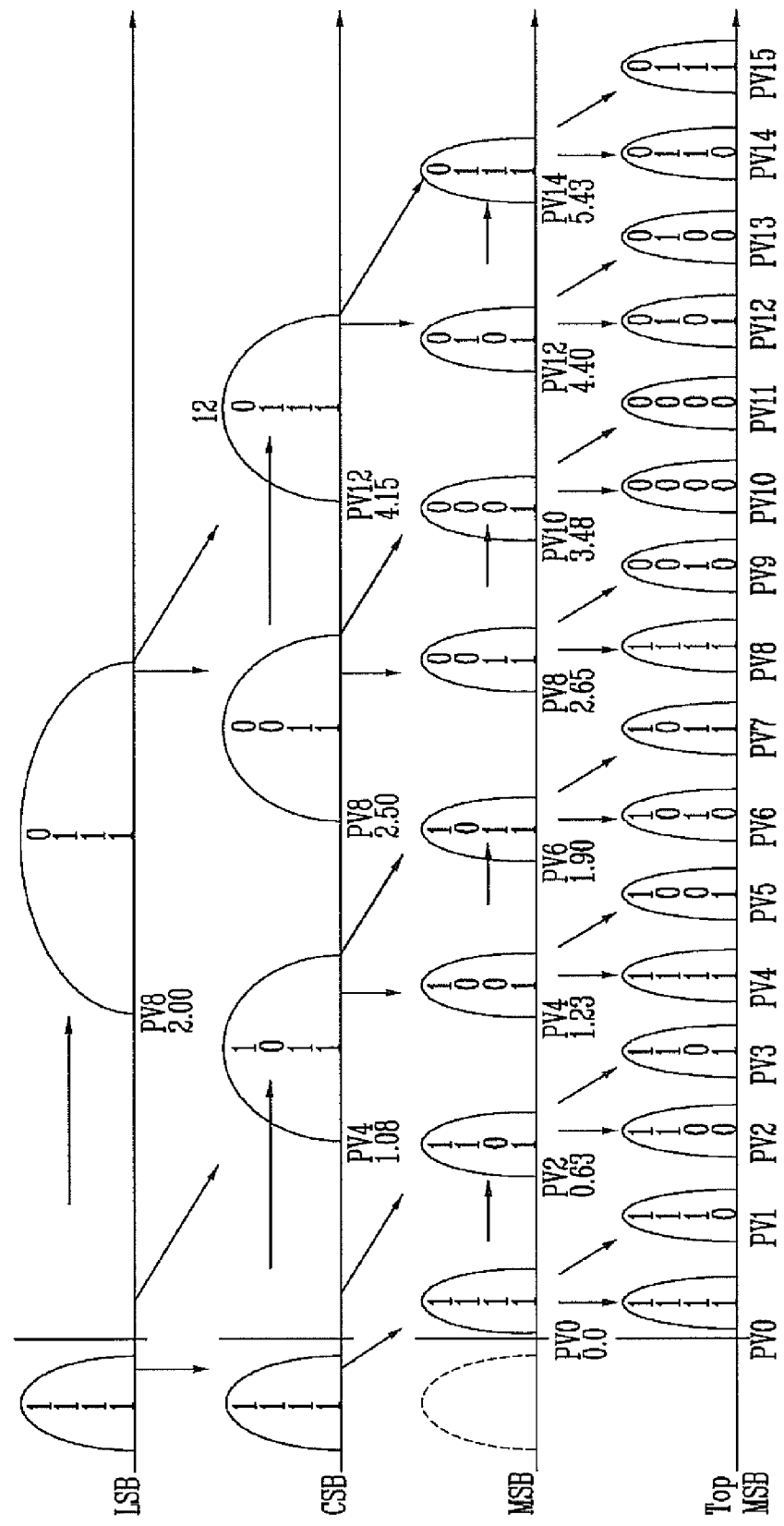
FIG. 1 illustrates shift of a threshold voltage distribution of a multi level cell.

FIG. 1 illustrates a shift of a threshold voltage distribution of a multi level cell.

In FIG. 1, it is verified that a threshold voltage distribution of a multi level cell MLC is shifted as a program operation is performed, wherein the MLC stores information having four bits.

Namely, in case that a least significant bit LSB program operation for programming information having one bit is performed, two threshold voltage distributions exist.

In case that a most significant bit MSB program operation for programming information having two bits is performed, two threshold voltage distributions are changed into four threshold voltage distributions.

In case that an MSB program operation for programming information having three bits is performed, four threshold voltage distributions are changed into eight threshold voltage distributions.

In case that a top MSB program operation for programming information having four bits is performed, eight threshold voltage distributions are changed into sixteen threshold voltage distributions.

As described above, a number of the threshold voltage distributions is increased as the program operation is continuously performed. Accordingly, a space between the threshold voltage distributions is narrowed, and so a margin for reading the data is reduced.

In addition, a number of the threshold voltage distributions is increased as a number of the bits stored in the memory cell is increased. Hence, the threshold voltage distribution having a higher voltage level may be generated.

Furthermore, the threshold voltage of the memory cell is changed depending on an ambient temperature. To compensate the above phenomenon, a non-volatile memory device of the present embodiment uses a read voltage changed in accordance with the ambient temperature.

Figure 2:
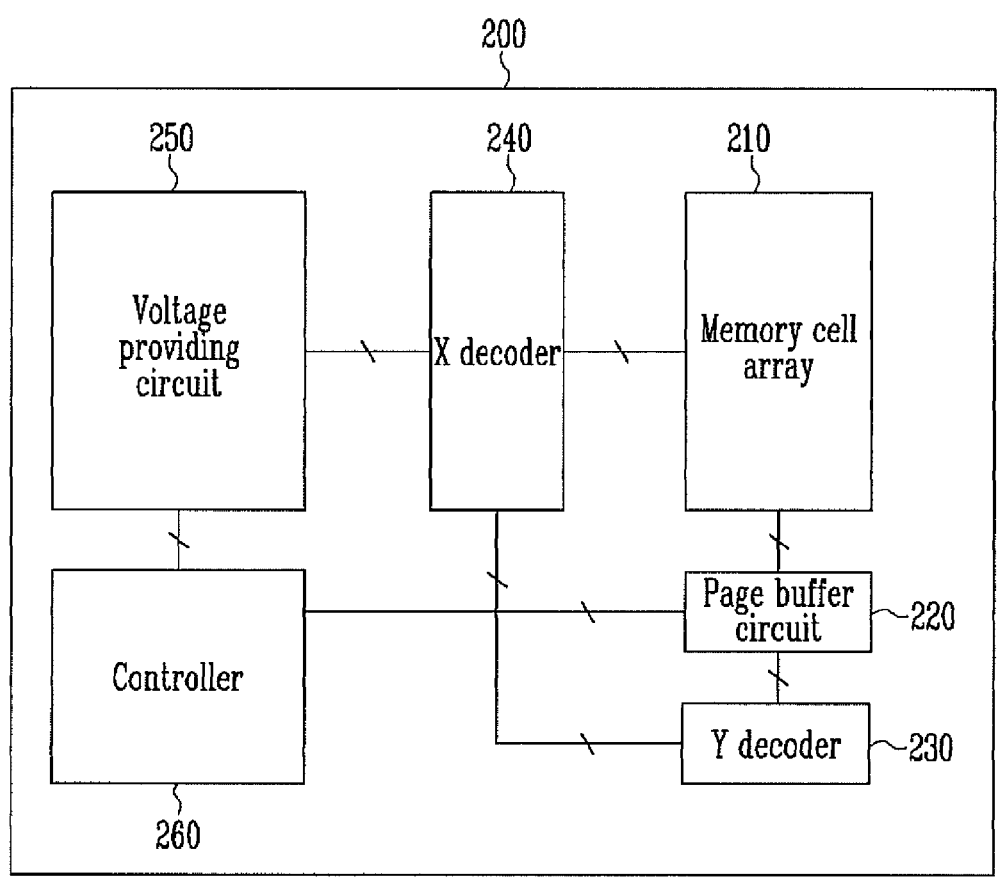
FIG. 2 is a block diagram illustrating a non-volatile memory device according to one example embodiment of the present invention.

FIG. 2 is a block diagram illustrating a non-volatile memory device according to one exemplary embodiment of the present invention.

In FIG. 2, a non-volatile memory device 200 of the present embodiment includes a memory cell array 210, a page buffer circuit 220, a Y decoder 230, an X decoder 240, a voltage providing circuit 250 and a controller 260.

The memory cell array 210 has memory cells for storing data, wherein the memory cells are coupled to word lines and bit lines. In one example embodiment of the present invention, the memory cell stores information having four bits.

The page buffer circuit 220 is coupled to the bit line, and includes page buffers. The page buffer provides data to be programmed to a specific memory cell through the bit line or stores data read from a given memory cell.

The Y decoder 230 provides input/output path of data for the page buffers.

The X decoder 240 selects the word lines of the memory cell array 210, thereby providing a path for provision of an operation voltage.

The voltage providing circuit 250 generates the operation voltage to be applied to the word line by the X decoder 240. Specially, the voltage providing circuit 250 generates the read voltage which is adjusted in accordance with an ambient temperature, and provides the generated read voltage. The voltage generating circuit 250 is controlled by the controller 260.

The controller 260 controls the voltage providing circuit 250, the X decoder 240, the page buffer circuit 220 and the Y decoder 230, thereby programming data in the memory cell array 210 or reading data from the memory cell array 210.

Hereinafter, an apparatus for outputting the read voltage in the voltage providing circuit 250 will be described in detail with reference to accompanying drawings.

Figure 3A:
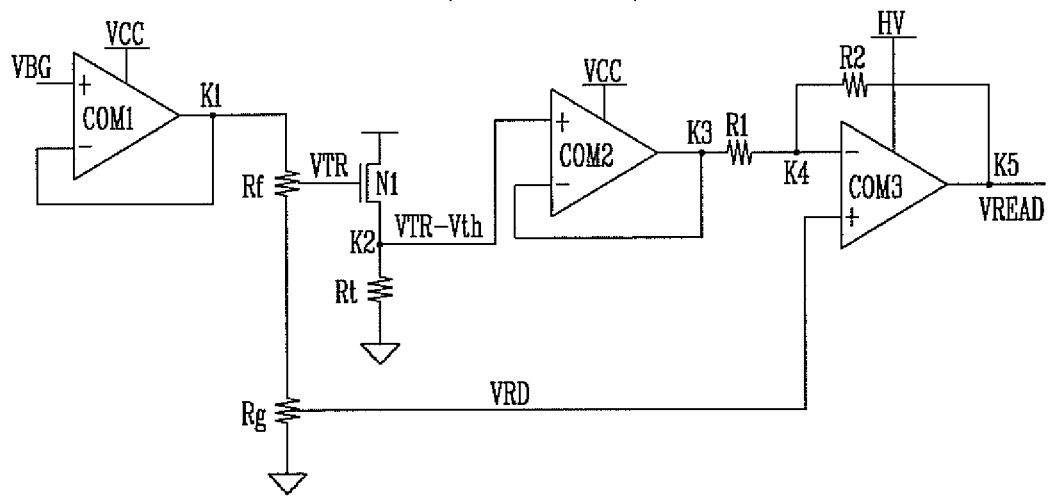
FIG. 3A illustrates circuitry of an apparatus for outputting the read voltage.

FIG. 3A illustrates an exemplary circuitry of an apparatus for outputting the read voltage.

In FIG. 3A, the apparatus for outputting the read voltage includes a first to third comparators COM1 to COM3, a first and second resistors R1 and R2, variable resistors Rf, Rg and Rt, and a first N-MOS transistor N1.

The first comparator COM1 and the second comparator COM2 each function as a buffer for outputting a received input voltage as an output signal. Here, a voltage VBG is applied to a non-inverting terminal (+) of the first comparator COM1, and an inverting terminal (−) of the first comparator COM1 is coupled to a node K1. Additionally, a voltage of a node K2 is applied to a non-inverting terminal (+) of the second comparator COM2, and an inverting terminal (−) of the second comparator COM2 is coupled to a node K3.

The variable resistor Rf and the variable resistor Rg are coupled in series between the node K1 and a ground node. Here, the variable resistor Rf is a resistor for dividing the voltage VBG into an operation voltage VTR. Additionally, the variable resistor Rg is a resistor for dividing the voltage VBG into a read voltage VRD.

The first N-MOS transistor N1 and the variable resistor Rt are coupled in series between a supply voltage node and the ground node.

The operation voltage VTR outputted by the variable resistor Rf is inputted to a gate of the first N-MOS transistor N1.

The variable resistor Rt is used to divide the supply voltage, as applied through the first N-MOS transistor N1, in accordance with ambient temperature.

A voltage of the node K2, which is adjusted in accordance with the ambient temperature, is inputted to the non-inverting terminal (+) of the second comparator COM2, and then is outputted to the node K3.

The first resistor R1 is coupled between the node K3 and a node K4 which is coupled to an inverting terminal (−) of the third comparator COM3.

The second resistor R2 is coupled between the inverting terminal (−) of the third comparator COM3 and a node K5 which is an output terminal.

The read voltage VRD, which is obtained through a voltage-division by the variable resistor Rg, is inputted to the non-inverting terminal (+) of the third comparator COM3.

A first read voltage VREAD is outputted through the node K5 in accordance with the read voltage VRD.

The read voltage VREAD outputted from the node K5 is obtained in accordance with the following expression 1.

$$VREAD = \left(\frac{R2}{R1}\right) \times (2VRD - VTR + Vth) \quad \text{[Equation 1]}$$

Referring to the equation 1, since the voltage (VTR-Vth) of the node K2 is changed in accordance with the ambient temperature, the read voltage VREAD is changed depending on the ambient temperature.

The first to third comparators COM1 to COM3 use an OP amplifier, which have limited voltage levels. Specially, a high voltage HV (for example, a driving voltage or a supply voltage higher than a supply voltage VCC) as an operation voltage is applied to the third comparator COM3, but the read voltage VREAD may not be outputted with a voltage greater than a maximum voltage of the third comparator COM3 because the third comparator COM3 can not output a voltage more than its maximum voltage.

However, a number of the threshold voltage distributions is increased as a number of bits to be stored in the multi level cell is increased. This means that a highest threshold voltage distribution is shifted in a direction of a high voltage.

Accordingly, to read the memory cells programmed to a high voltage, an apparatus for generating a high read voltage VREAD has been required. However, the apparatus for generating the read voltage in FIG. 3A may generate the read voltage VREAD having only a limited level. That is, the level of the read voltage VREAD is limited.

To compensate the above phenomenon, the present invention provides an apparatus for generating a read voltage as shown in below FIG. 3B.

Figure 3B:
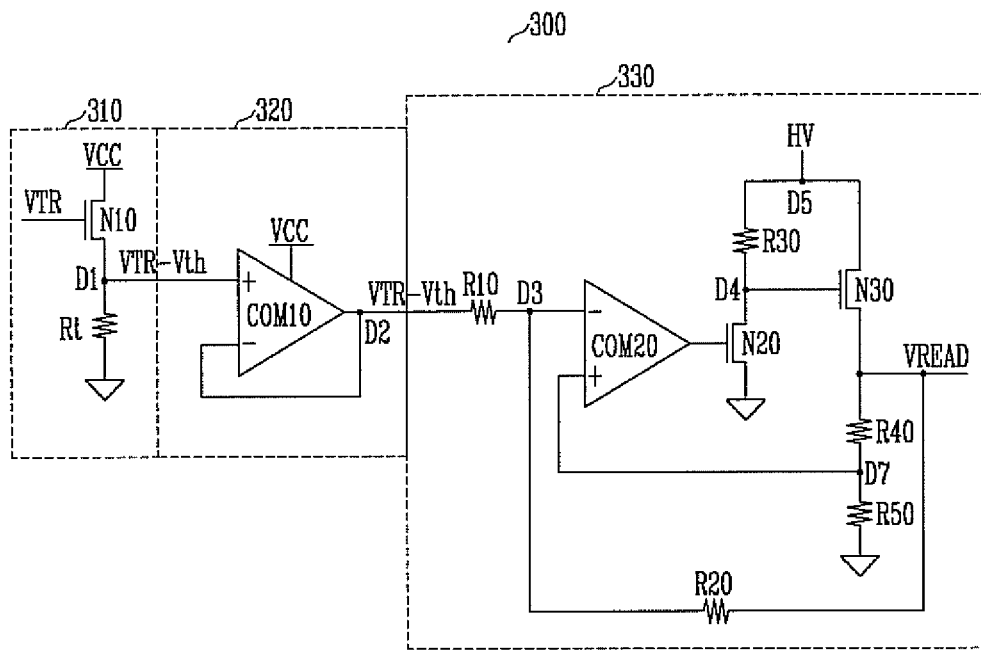
FIG. 3B illustrates an apparatus for generating a read voltage according to one example embodiment of the present invention.

FIG. 3B illustrates an apparatus for generating a read voltage according to one exemplary embodiment of the present invention.

In FIG. 3B, the apparatus 300 for generating the read voltage includes a first voltage outputting circuit 310, a second voltage outputting circuit 330 and a buffer circuit 320.

The first voltage outputting circuit 310 includes a first N-MOS transistor N10 and a resistor Rt.

The buffer circuit 320 has a first comparator COM10.

The second voltage outputting circuit 330 includes first to fifth resistors R10 to R50, a second N-MOS transistor N20 and a second comparator COM20.

The first voltage outputting circuit 310 outputs a voltage (VTR-Vth) generated by changing a supply voltage in accordance with an operation voltage VTR and the ambient temperature.

The buffer circuit 320 outputs the voltage (VTR-Vth) outputted from the first voltage outputting circuit 310 to a node D2.

The second voltage outputting circuit 330 outputs a read voltage in accordance with the voltage (VTR-Vth).

The first N-MOS transistor N10 and the resistor Rt are coupled in series between a supply voltage node and a ground node. Here, the operation voltage VTR is applied to a gate of the first N-MOS transistor N10.

The voltage (VTR-Vth), which is adjusted in accordance with the ambient temperature, is outputted from a node D1 which is a connection point of the first N-MOS transistor N10 and the resistor Rt.

The voltage (VTR-Vth) at the node D1 is outputted at the node D2 through the buffer circuit 320.

The first resistor R10 is coupled between the node D2 and a node D3.

The node D3 is coupled to an inverting terminal (−) of the second comparator COM20.

The second resistor R20 is coupled between the node D3 and a node D6.

The third resistor R30 and the second N-MOS transistor N20 are coupled in series between the node D5 and the ground node.

A high voltage HV is applied to the node D5.

A gate of the second N-MOS transistor N20 is coupled to an output terminal of the second comparator COM20.

The third N-MOS transistor N30, the fourth resistor R40 and the fifth resistor R50 are coupled between the node D5 and the ground node.

A gate of the third N-MOS transistor N30 is coupled to the node D4 which is an intervening node between the third resistor R30 and the second N-MOS transistor N20.

The read voltage VREAD is outputted through the node D6 which is an intervening node between the third N-MOS transistor N30 and the fourth resistor R40.

The read voltage VREAD has a voltage value in accordance with resistance ratios of the third N-MOS transistor N30, the fourth resistor R40 and the fifth resistor R50.

A node D7 between the fourth resistor R40 and the fifth resistor R50 is coupled to a non-inverting terminal (+) of the second comparator COM20.

Hereinafter, the apparatus for generating the read voltage will be described in detail.

In case that the first voltage outputting circuit 310 outputs the voltage (VTR-Vth), which is adjusted in accordance with the ambient temperature, the buffer circuit 320 outputs at the node D2 the voltage (VTR-Vth) for driving the second voltage outputting circuit 330.

In case that the second N-MOS transistor N20 is turned off, the third N-MOS transistor N30 is turned on in accordance with a voltage of the node D4. In addition, the read voltage VREAD is outputted with a voltage value dependent on the resistance ratios of the third N-MOS transistor N30, the fourth resistor R40 and the fifth resistor R50. Here, a voltage of the node D7 is smaller than that inputted to the inverting terminal (−) of the second comparator COM20.

The read voltage VREAD is inputted to the inverting terminal (−) of the second comparator COM20 through a feedback.

In case that a voltage level of the high voltage HV is increased, a voltage of the node D6 and a voltage of the node D7 are also increased. Here, in case that a voltage inputted to the non-inverting terminal (+) of the second comparator COM20 becomes higher than that inputted to the inverting terminal (−) of the second comparator COM20, the second comparator COM20 outputs a signal having high level. As a result, the second N-MOS transistor N20 is turned on.

In case that the second N-MOS transistor N20 is turned on, the node D4 is coupled to the ground node. Accordingly, the third N-MOS transistor N30 is turned off, and so the read voltage VREAD is not increased any more.

That is, the apparatus 300 of the present embodiment maintains a constant level of the read voltage VREAD by inputting the read voltage VREAD to the second comparator COM20 through the feedback.

In brief, the read voltage VREAD is generated by the third N-MOS transistor N30, the third to fifth resistors R30 and R50. This read voltage VREAD is controlled by the second comparator COM20. Here, since the read voltage VREAD is directly generated by using the high voltage HV, a voltage level of the read voltage VREAD is not limited as in the case of the FIG. 3A circuit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for generating a voltage comprising:
   a first voltage outputting circuit configured to adjust a supply voltage in response to an input voltage to output a first voltage which is changed in accordance with a temperature;
   a buffer circuit configured to first voltage as a second voltage; and
   a second voltage outputting circuit configured to output a third voltage by dividing a driving voltage which is higher than the supply voltage in response to the second voltage which is received at an input terminal, wherein the third voltage feeds back to the input terminal.

2. The apparatus of claim 1, wherein the second voltage outputting circuit comprising:
   a sub-voltage outputting circuit configured to output the third voltage by dividing the driving voltage in response to a control signal and output a fourth voltage by dividing the third voltage; and
   a controlling circuit configured to output the control signal in response to the third voltage and the fourth voltage.

3. The apparatus of claim 2, wherein the sub-voltage outputting circuit includes:
   a switching means coupled between a driving voltage input terminal and a node at which the third voltage is outputted; and
   a first resistor and a second resistor configured to divide the third voltage inputted through the switching means in accordance with a resistance ratio of the first and second resistors,
   and wherein the switching means, the first resistor and the second resistor are coupled in series between the driving voltage input terminal and a ground node, and the third voltage is configured to be outputted from the node between the switching means and the first resistor.

4. The apparatus of claim 3, wherein the fourth voltage is configured to be outputted from a node between the first resistor and the second resistor.

5. The apparatus of claim 3, wherein the controlling circuit is a comparing circuit,
   and wherein the third voltage is inputted to an inverting terminal of the comparing circuit through the feedback, the fourth voltage is inputted to a non-inverting terminal of the comparing circuit, and the comparing circuit is configured to compare the third voltage with the fourth voltage and output the control signal in accordance with the comparison result.

6. The apparatus of claim 5, wherein the switching means is controlled by the control signal.

7. An operating method of a non-volatile memory device, the method comprising:
   generating a first voltage having a voltage level that varies in response to a temperature change by adjusting a supply voltage according to an input voltage;
   receiving the first voltage at a non-inverting input node of an amplifier and feeding a second voltage at an output node of the amplifier to an inverting input node of the amplifier;
   providing an operation voltage by dividing a driving voltage higher than the supply voltage; and
   feeding back the operation voltage to a comparator and adjusting the operation voltage in response to the comparison.

8. The method of claim 7, wherein the operation voltage is used for a read or verification operation of a memory cell array.

9. The method of claim 7, wherein the amplifier receives the supply voltage as a power supply.

10. The method of claim 7, wherein the first voltage is generated at an intervening node between a transistor coupled to the supply voltage and a resistor coupled to ground.

* * * * *